(12) United States Patent
Donnelly et al.

(10) Patent No.: US 11,216,535 B2
(45) Date of Patent: Jan. 4, 2022

(54) PROBABILITY MASS REDISTRIBUTOR DEVICE

(71) Applicant: University College Cork—National University of Ireland, Cork, Cork (IE)

(72) Inventors: Yann Donnelly, Cork (IE); Michael Peter Kennedy, Dalkey (IE)

(73) Assignee: University College Cork—National University of Ireland, Cork, Cork (IE)

( * ) Notice: Subject to any disclaimer, the term of this patent is extended or adjusted under 35 U.S.C. 154(b) by 186 days.

(21) Appl. No.: 16/742,835

(22) Filed: Jan. 14, 2020

(65) Prior Publication Data

US 2020/0250256 A1 Aug. 6, 2020

Related U.S. Application Data

(60) Provisional application No. 62/793,136, filed on Jan. 16, 2019.

(51) Int. Cl.
*H03L 7/197* (2006.01)
*G06F 17/18* (2006.01)
*H03M 3/00* (2006.01)

(52) U.S. Cl.
CPC ............ *G06F 17/18* (2013.01); *H03L 7/1974* (2013.01); *H03M 3/418* (2013.01)

(58) Field of Classification Search
CPC .......................... H03L 7/1974; H03L 7/1976
See application file for complete search history.

(56) References Cited

U.S. PATENT DOCUMENTS

| | | | | |
|---|---|---|---|---|
| 7,417,514 B2* | 8/2008 | Zachan | ............... | H04L 27/2046 332/127 |
| 7,986,250 B2* | 7/2011 | Galton | ............... | H03M 7/3002 341/50 |
| 9,584,143 B2* | 2/2017 | Huang | ................. | H03L 7/1976 |
| 10,541,707 B2* | 1/2020 | Mo | ....................... | H03M 3/434 |

\* cited by examiner

*Primary Examiner* — Patrick O Neill
(74) *Attorney, Agent, or Firm* — Loza & Loza, LLP; Anthony G. Smyth

(57) ABSTRACT

The present invention provides a probability mass redistributor device comprising an input port and an output port. The device comprises a mapping block configured to perform a selected mapping function from a plurality of mapping functions on a random bitstream to generate an output signal having a desired probability mass function, at least one difference block, wherein the input to the at least one difference block comprises the output from the mapping block, and the output of the at least one difference block produces a modulation term, and wherein the output of each difference block is the difference between a previous value of the input signal to the block and a current value of the input signal to the block, and a summing block for summing a signal received by the input port and the modulation term to form an output signal.

15 Claims, 6 Drawing Sheets

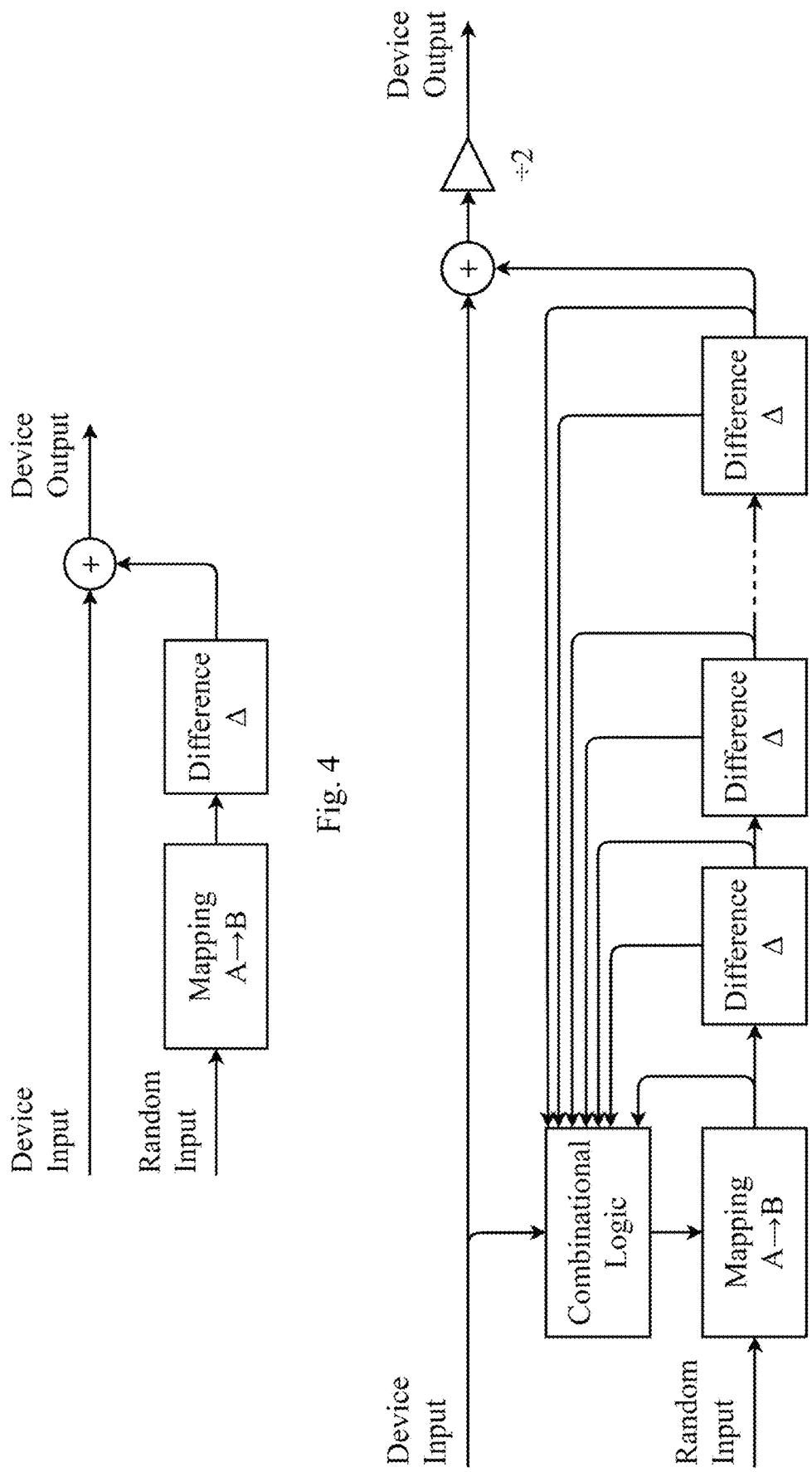

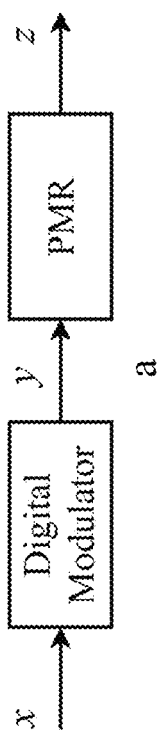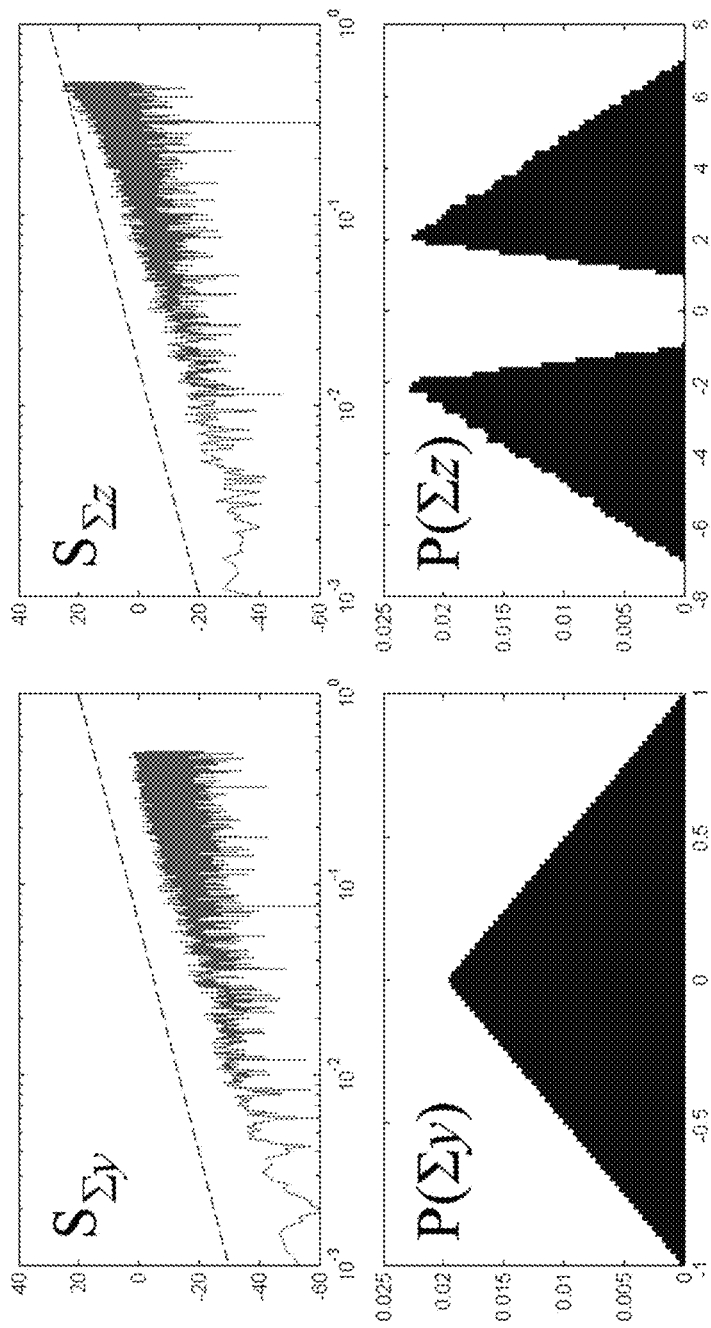
Fig. 7

PROBABILITY MASS REDISTRIBUTOR DEVICE

CROSS-REFERENCE TO RELATED APPLICATIONS

This application claims priority to and the benefit of provisional patent application No. 62/793,136 filed in the United States Patent Office on Jan. 16, 2019, the entire content of which is incorporated herein by reference as if fully set forth below in its entirety and for all applicable purposes.

FIELD

The present invention is related to the field of radio frequency synthesis. More particularly, the invention is related to the digital modulation component of radio frequency synthesis.

BACKGROUND

Radio frequency synthesis is a common operation in communications systems. The primary goal is to synthesize a signal with a fundamental frequency component at a precise frequency, typically in the radio frequency range. A desirable outcome is that this signal is devoid of spurious frequency and noise components.

A block diagram of the architecture of a typical fractional-N frequency synthesizer (Phase Locked Loop) is shown in FIG. 1. A phase frequency detector (PFD) receives a reference frequency $f_{PFD}$. The output signal from the phase frequency detector is passed through a charge pump and onto a loop filter. The output of the loop filter is then fed to a voltage controlled oscillator (VCO). The output frequency of the voltage controlled oscillator is fed to a multi modulus divider (DIV), which counts an integer number of cycles of the output frequency and generates the divided frequency as an input to the phase frequency detector, thus forming the synthesizer's phase-locked loop. A digital modulator (MOD) controls the frequency divider.

One digital modulator which is commonly used in a fractional-N frequency synthesizer is a Digital Delta-Sigma Modulator (DDSM) such as the Multi-stAge noise SHaping (MASH) DDSM. An example of the MASH 1-1-1 modulator is shown in FIG. 2. It consists of a chain of digital delta-sigma modulators whose outputs are combined in an error cancellation network. Another digital modulator which is commonly implemented in a fractional-N frequency synthesizer is a successive requantizer, an example of which is shown in FIG. 3a. This digital modulator comprises a cascade of identical quantization blocks, with the components within each of these quantization blocks being shown in FIG. 3b.

One drawback of a fractional-N frequency synthesizer is the presence of spurious frequency components in the synthesizer's output spectrum. These spurious frequency components are caused by the interaction between the output of the digital modulator and circuit nonlinearities.

While both the digital delta-sigma modulator and the successive requantizer are designed to reduce the direct feedthrough of certain quantization and additive noise components in a fractional-N frequency synthesizer, the presence of spurious frequency components in the output spectrum is still an issue. It is also known that the occurrence of spurious frequency components can be reduced in a successive requantizer when the circuit nonlinearity assumes a prescribed polynomial shape.

It is therefore an object of the present invention to provide an electronic device which is suitable for use in a fractional-N frequency synthesizer which further reduces such spurious frequency components in the output spectrum of the synthesizer.

SUMMARY

According to a first aspect of the invention there is provided, as set out in the appended claims, a probability mass redistributor device comprising an input port and an output port, the device comprising: a mapping block configured to perform a selected mapping function from a plurality of mapping functions on a random bitstream to generate an output signal having a desired probability mass function; at least one difference block, wherein the input to the at least one difference block comprises the output from the mapping block, and the output of the at least one difference block produces a modulation term, and wherein the output of each difference block is the difference between a previous value of the input signal to the block and a current value of the input signal to the block; and a summing block for summing a signal received by the input port and the modulation term to form an output signal.

In one embodiment, the mapping function is selected independently of the input signal.

In one embodiment, the mapping function is selected to ensure that the parity of the modulation term is equal to the parity of the input signal.

In one embodiment, the parity of each signal comprises the value of the least significant bit of each signal.

In one embodiment, the device further comprises a combinational logic block in communication with the mapping block to select the mapping function based on combinational logic.

In one embodiment, the combinational logic for the selection of the mapping function is based on previous and current values of the output of each difference block and previous and current values of the parity of the input signal.

In one embodiment, the combinational logic for the selection of the mapping function is further based on a previous output value of the mapping block.

In one embodiment, the plurality of mapping functions are programmable.

In one embodiment, the device further comprises a one-bit quantizer coupled to the summing block to quantize the result of the summation to produce an output signal of the device at the output port.

In one embodiment, the one-bit quantizer is configured to remove the least-significant bit of the result of the summation.

In one embodiment, the one-bit quantizer comprises a divide-by-two block.

In one embodiment, the one or more difference blocks comprise a plurality of difference blocks connected in feedforward cascade.

In another aspect of the invention there is provided a fractional-N frequency synthesizer comprising: a digital modulator; a feedback divider; and the probability mass redistributor device, wherein the output of the digital modulator is coupled to the input port of the device, and the output port of the device is coupled to the input of the feedback divider.

In one embodiment, the digital modulator comprises a MASH 1-1-1 digital modulator.

In another embodiment, the digital modulator comprises a successive requantizer digital modulator.

BRIEF DESCRIPTION OF THE DRAWINGS

The invention will be more clearly understood from the following description of an embodiment thereof, given by way of example only, with reference to the accompanying drawings, in which:

FIG. 3b shows the main components of each of quantization blocks of the successive requantizer digital modulator of FIG. 3a;

FIG. 4 shows a block diagram of one embodiment of the probability mass distributor device of the present invention;

FIG. 5 shows a block diagram of another embodiment of the probability mass distributor device of the present invention;

FIG. 6b shows one embodiment of the mapping block and combinational logic block in FIG. 6a;

FIG. 7 shows the spectra $S_{\Sigma y}$ and $S_{\Sigma z}$ of the output y of a digital modulator and the output z of the probability mass redistributor device of the present invention, when it receives as input the output of the digital modulator, as well as the probability mass functions $P(\Sigma y)$ and $P(\Sigma z)$ of the accumulations of output y and output z.

DETAILED DESCRIPTION

Figures 1, 2:
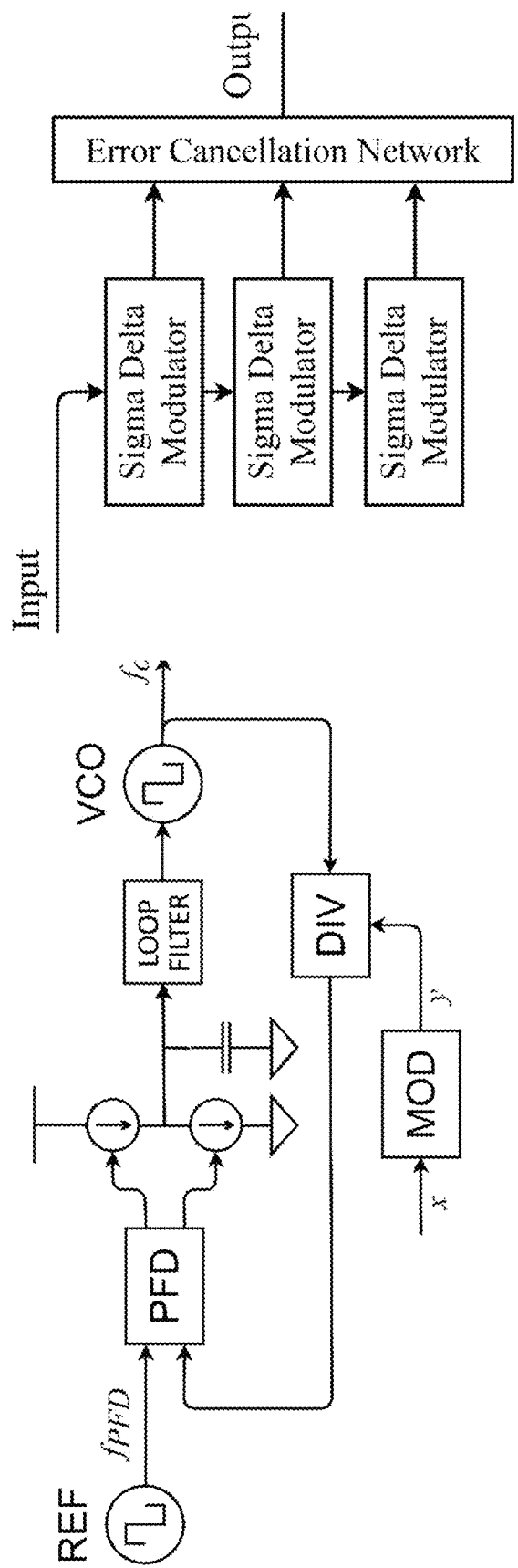
FIG. 1 shows a block diagram of the architecture of a typical fractional-N frequency synthesizer.
FIG. 2 shows a block diagram of the MASH 1-1-1 digital modulator.
Figure 3A:
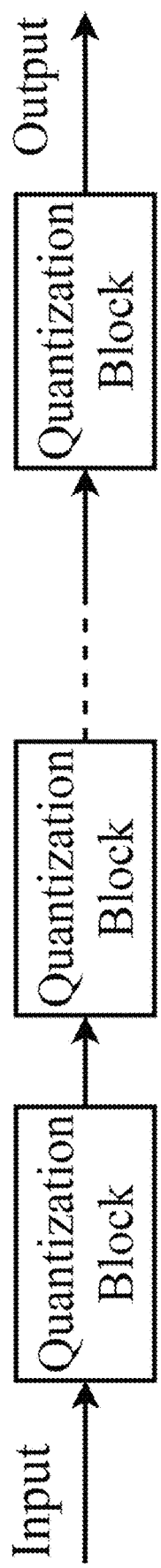
FIG. 3a shows a block diagram of a successive requantizer digital modulator.
Figure 3B:
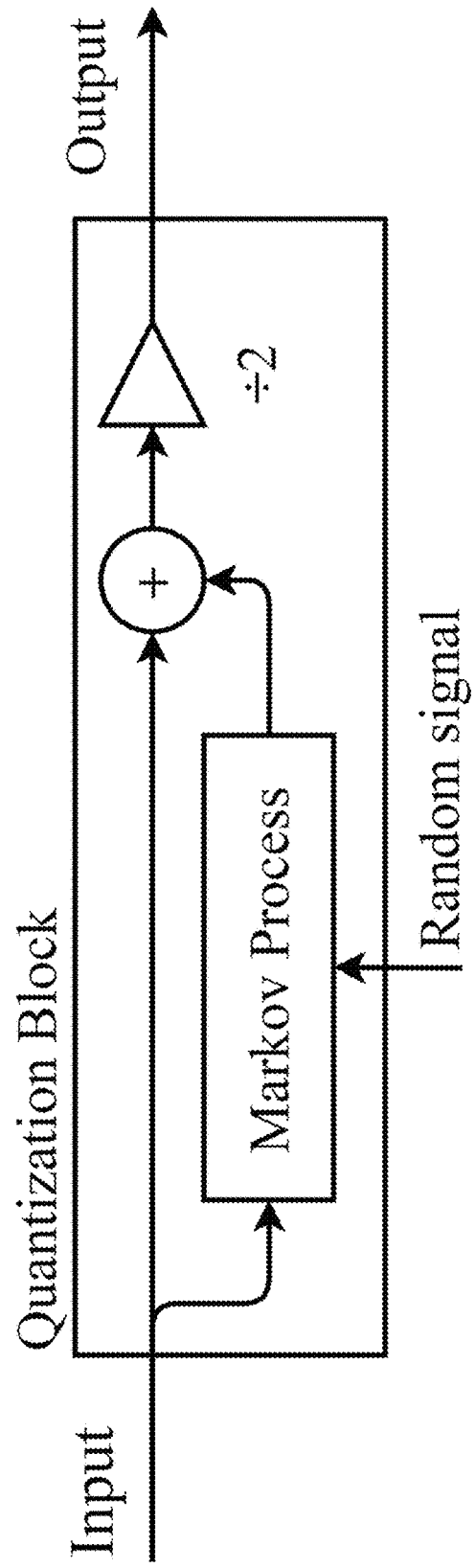

In a conventional digital modulator, the output signal of the modulator is distributed over a small set of levels. This is done in a deterministic manner and results in the generation of a pattern of quantization noise that produces spurs when the digital modulator is a component in a fractional-N frequency synthesizer architecture. The extent of the noise depends on the shape of the probability mass function (PMF) of the modulator's output.

The present invention provides a probability mass redistributor device which in one embodiment can be used to modify the shape of the probability mass function of the output signal of a digital modulator to an optimal shape to minimize spurs when the modulator is being used in a fractional-N frequency synthesizer. The shape of the PMF of the output signal of the digital modulator is changed by the device redistributing the output samples of the modulator in such a way that the resulting in band spurs are smaller in amplitude. This is achieved without impacting on the noise-shaping spectral properties of the frequency spectrum of the output of the digital modulator. Furthermore, the probability mass redistributor device can be adapted to a variety of nonlinearities due to its programmability.

FIG. 4 shows a block diagram of one embodiment of the probability mass distributor device of the present invention. It comprises a mapping block, a difference block and a summing block. The mapping block receives a random signal and performs a mapping function on the random input signal in order to transform the random signal into a signal with a desired probability mass function. In the embodiment of FIG. 4, the mapping function of the mapping block is selected independently of the input signal.

The difference block performs noise shaping on the output of the mapping block and produces a modulation term as an output. This modulation term is applied to the input signal received by the device (labelled "Device Input" in the drawings) through the summing block.

FIG. 5 shows another embodiment of the probability mass distributor device. This embodiment is similar to the embodiment of FIG. 4, in that it also comprises a mapping block and a summing block. However, the embodiment also comprises a plurality of difference blocks connected in a feedforward cascade, as well as a combinational logic block and a quantizer.

In the embodiment of FIG. 5, the choice of mapping function is determined by the random signal and the output of the combinational logic block. The output of the mapping block is fed to the input of the first difference block, as well as to the combinational logic block.

The plurality of difference blocks perform noise shaping on the output of the mapping block. The output of the final difference block produces a modulation term as an output. This modulation term is applied to the input signal received by the device through the summing block. The summed signal is then input to a divide-by-2 block, which implements a 1-bit quantizer. The output of this divide-by-2 block constitutes the device output signal.

The combination logic block is configured to constrain the input to the difference blocks to a desired parity, as will be explained in detail in paragraphs below. The combinational logic block receives as an input the parity of the input signal to the device as well as the output of each difference block.

The probability mass redistributor device of the invention is suitable for incorporation into a fractional-N frequency synthesizer by positioning the device in series between the digital modulator and the feedback divider. When being used in this manner, the input signal to the device corresponds to the output signal of the digital modulator.

Figure 6B:
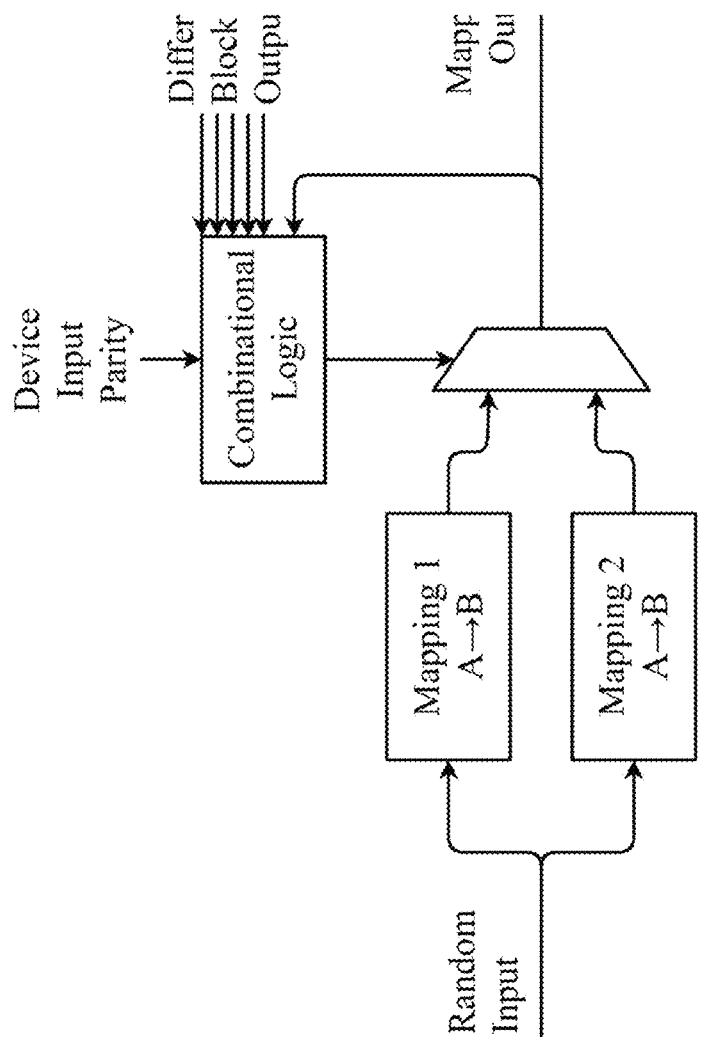
Figure 6A:
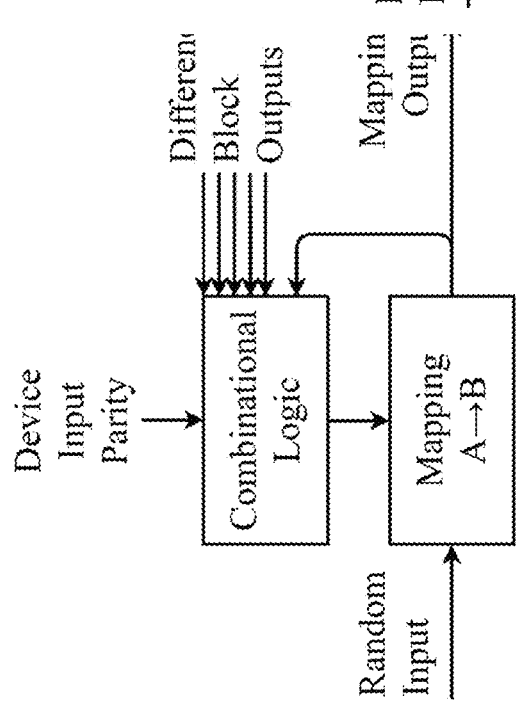
FIG. 6a shows a block diagram of the mapping block and combinational logic block of the probability mass distributor device of FIG. 5.

A block diagram of the mapping block and the combinational logic block of FIG. 5 is shown in FIG. 6a. While the mapping function is shown in this Figure as being potentially dependent on either or both of the output of the mapping block and the difference block output parities, this does not imply any particular implementation of the mapping.

The mapping block can apply a fixed many-to-many mapping to the random signal in order to generate an output signal with a desired PMF. Therefore, for each possible value that the random signal can assume, there is a single corresponding output from the mapping block. The relationship between the chosen mapping function and the PMF of the output signal from the mapping block depends on the PMF of the random signal. The particular mapping function which is applied to a random input signal is determined by the output from the combinational logic block.

If the random input signal is generated by a uniform noise source (i.e. white noise), then the number of distinct mapping outcomes whose outputs assume a certain value is proportional to the probability of that value occurring in the output signal of the mapping block. The PMF of the output of the mapping block in the case of a uniform noise source is given by:

$$P(a) = \frac{N_{\to a}}{2^{N_b}}$$

Where $N_{\to a}$ is the number of distinct mapping outcomes which result in a, and $N_b$ is the number of bits (i.e. the word length) of the random input signal.

FIG. 6b shows an exemplary embodiment of the mapping block and combinational logic block of FIG. 6a, where multiple mapping functions are performed and the mapping function which is applied to the random input signal to provide the desired parity of output signal from the mapping block is determined by the output of the combinational logic block.

The properties of the quantization noise of a digital modulator connected to the device input are preserved if the result of the summation of the device input with the modulation term is even. This means that the device input and the output of the final difference block (the modulation term) should both have the same parity. Parity in this context refers to the value of the least significant bit of each signal, which dictates whether the value is even or odd.

The parity of the summation result is related to the parities of present and past values of the output of the mapping block. The required parity of the output of the mapping block to produce a desired output from the final difference block is determined by means of the combinational logic block.

For ease of understanding, how this functionality is performed in the combinational logic block will be explained using an exemplary embodiment of a device which only has a single difference block.

Denoting the input to this single difference block which is the output of the mapping block by a, and denoting the output of the difference block by b, then it will be understood that it is desired to match the parity of the device input, x, to the parity of b. This can be shown notationally as:

$$\langle b[n] \rangle_2 = \langle x[n] \rangle_2$$

where parity is denoted using the operator $\langle \ \rangle_2$.

The difference block implements the function $b[n]=a[n]-a[n-1]$. The preceding equality is thus equivalent to:

$$\langle a[n]-a[n-1] \rangle_2 = \langle x[n] \rangle_2$$

This places the following constraint on the mapping function:

$$\langle a[n] \rangle_2 = \langle x[n]+a[n-1] \rangle_2$$

which can be implemented by constraining the mapping to values with the parity given by the following combinational logic expression:

$$\langle x[n] \rangle_2 \oplus \langle a[n-1] \rangle_2$$

where $\oplus$ denotes the exclusive OR operation, and the $a[n-1]$ signal is readily obtainable from the difference block.

It will be appreciated that a combinational logic expression can be obtained for other embodiments having a number of difference blocks in a similar fashion.

It is necessary to ensure that the PMF device of the invention, when being used in a fractional-N synthesizer, does not negatively impact on the noise-shaping spectral properties of the frequency spectrum of the output of the digital modulator to which the device is connected. In the case of a fractional-N synthesizer, it is desirable to concentrate the modulation noise at higher frequencies.

Constraining the frequency representation to higher frequencies is achieved through the use of one or more difference blocks which are configured to generate shaped noise. Each block carries out a digital differencing operation, which consists of subtracting a previous value of the block input from the current value of the block input. Representing the independent variable of time with the variable n, this can be described as:

$$b[n]=a[n]-a[n-1].$$

In the embodiment of FIG. 5, each difference block feeds a signal back to the combinational logic block, such that each difference block influences the choice of mapping function. Thus, the output from the combinational logic block modifies the random input signal, such that, were a straight line drawn in the frequency domain of the input signal to the mapping block, the corresponding representation in the frequency domain of the output of the mapping block would be that of a straight line skewed relative to the previous line, with a difference of 20 dB/decade in their slopes, the output line being higher at high frequencies and lower at low frequencies.

It is assumed that the random noise signal has a flat frequency domain representation, that is, it can be approximated by a horizontal line in the frequency domain. It follows that the output signal of the mapping function likewise has a flat frequency domain representation. The operation of k difference blocks on the input to the mapping block will produce an output signal from the mapping block whose frequency domain representation can be approximated by a straight line with a slope of 20 k dB/decade, the line being higher at higher frequencies; thus, the spectral content of the final difference block output is concentrated at higher frequencies. The probability mass function (PMF) of the final difference block output is related to the PMF of the output signal of the mapping block and is thus also dependent on the choice of mapping function.

The expense in area and power consumption required to implement the aforementioned modulation scheme is offset by the fact that the device of the present invention can be designed so as to quantize the input signal received from the digital modulator, thus reducing the degree of quantization which must be performed by the digital modulator. In the FIG. 5 embodiment of the invention, quantization is provided by the divide-by-2 block implementing a 1-bit quantizer. The output of the final difference block is added to the device input by the summing block, before 1-bit quantization is carried out by the quantizer by removing the least-significant bit of the summation result. The output of the quantizer is the device output, which, when the device of the invention is incorporated into a fractional-N frequency synthesizer, corresponds to the control signal of the feedback divider.

FIG. 7 shows the spectra $S_{\Sigma y}$ and $S_{\Sigma z}$ of the output y of a digital modulator and the output z of the probability mass redistributor device of the present invention, when it receives as input the output of the digital modulator. FIG. 7 also shows the probability mass functions P ($\Sigma$y) and P ($\Sigma$z) of the accumulations of the output y and the output z respectively. It can be seen that the probability mass function of the accumulation of the output y is symmetrical and unimodal, while the probability mass function of the accumulation of the output z is symmetrical and bimodal. y has a mean of $x/2^m$, where x is the input to the digital modulator and m is the number of stages of the modulator, while z has a mean of $(x/2^m)/2$.

Figure 8:
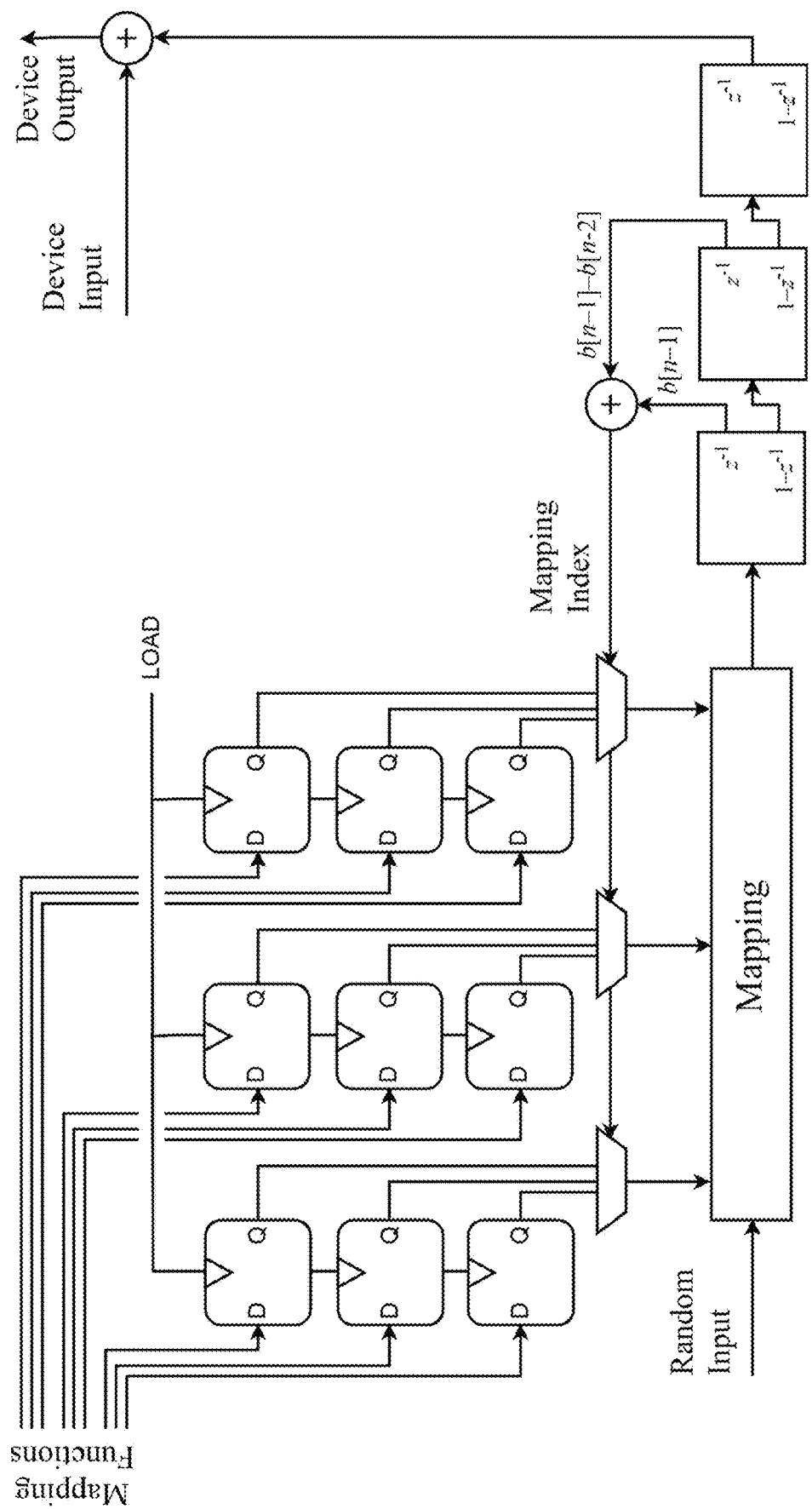
FIG. 8 shows an exemplary embodiment of how the programmable mapping function could be implemented by the probability mass redistributor device of the invention.

FIG. 8 shows an exemplary embodiment of how the programmable mapping function may be implemented by the probability mass redistributor device of the invention. In this embodiment, a family of three mapping functions are held in a programmable memory arranged in a 3×3 grid. For each individual mapping function, a particular mapping function is chosen based on the value of a Mapping Index, and this function is used in the mapping block to map the current value of the random input signal and thus generate an output of the mapping block.

As previously explained, the output value of the mapping block is passed through one or more difference blocks to produce the modulation term. This modulation term is then applied to the device input signal (which is typically the output signal of a digital modulator) by means of the summing block. In the embodiment of FIG. 5, previous values of the mapping output are extracted from the difference blocks in order to determine the next Mapping Index. In this embodiment, the chosen mapping function is designed to allow the PMF of the accumulation of the modulation term to be easily defined through reprogramming of the mapping functions in order to achieve a desired PMF. The mapping functions can be reprogrammed asynchronously by activating a "LOAD" signal, either in response to manual or programmed intervention, or by using external feedback circuitry.

It will thus be appreciated that the probability mass redistributor device of the present invention, when placed in series between a digital modulator and a feedback divider of a fractional-N synthesizer, results in the suppression of in-band spurs in the synthesizer. The device is designed to add its own quantization noise to the modulation noise exhibited by the digital modulator which mimics the high-pass spectral profile of the modulation noise of the digital modulator but changes the probability mass function of the modulation noise. By performing this in a programmable manner, it allows the probability mass function of the modulation noise to be changed so as to improve nonlinearity performance on the fly, while maintaining the high-pass shape of the modulation noise.

In the specification the terms "comprise, comprises, comprised and comprising" or any variation thereof and the terms include, includes, included and including" or any variation thereof are considered to be totally interchangeable and they should all be afforded the widest possible interpretation and vice versa.

The invention is not limited to the embodiments hereinbefore described but may be varied in both construction and detail.

The invention claimed is:

1. A probability mass redistributor device comprising an input port and an output port, the device comprising:
 a mapping block configured to perform a selected mapping function from a plurality of mapping functions on a random bitstream to generate an output signal having a desired probability mass function;
 at least one difference block, wherein the input to the at least one difference block comprises the output from the mapping block, and the output of the at least one difference block produces a modulation term, and wherein the output of each difference block is the difference between a previous value of the input signal to the block and a current value of the input signal to the block; and
 a summing block for summing a signal received by the input port and the modulation term to form an output signal.

2. The device of claim 1, wherein the mapping function is selected independently of the input signal.

3. The device of claim 1, wherein the mapping function is selected to ensure that the parity of the modulation term is equal to the parity of the input signal.

4. The device of claim 3, wherein the parity of each signal comprises the value of the least significant bit of each signal.

5. The device of claim 1, further comprising a combinational logic block in communication with the mapping block to select the mapping function based on combinational logic.

6. The device of claim 5, wherein the combinational logic for the selection of the mapping function is based on previous and current values of the output of each difference block and previous and current values of the parity of the input signal.

7. The device of claim 6, wherein the combinational logic for the selection of the mapping function is further based on a previous output value of the mapping block.

8. The device of claim 1, wherein the plurality of mapping functions are programmable.

9. The device of claim 1, further comprising a one-bit quantizer coupled to the summing block to quantize the result of the summation to produce an output signal of the device at the output port.

10. The device of claim 9, wherein the one-bit quantizer is configured to remove the least-significant bit of the result of the summation.

11. The device of claim 9, wherein the one-bit quantizer comprises a divide-by-two block.

12. The device of claim 1, wherein the one or more difference blocks comprise a plurality of difference blocks connected in feedforward cascade.

13. A fractional-N frequency synthesizer comprising:
 a digital modulator;
 a feedback divider; and
 the probability mass redistributor device of claim 1, wherein the output of the digital modulator is coupled to the input port of the device, and the output port of the device is coupled to the input of the feedback divider.

14. The fractional-N frequency synthesizer of claim 13, wherein the digital modulator comprises a MASH 1-1-1 digital modulator.

15. The fractional-N frequency synthesizer of claim 13, wherein the digital modulator comprises a successive requantizer digital modulator.

* * * * *